April 17, 1973 R. A. MOLINE 3,728,161

INTEGRATED CIRCUITS WITH ION IMPLANTED CHAN STOPS

Filed Dec. 28, 1971 2 Sheets-Sheet 1

INTEGRATED CIRCUITS WITH ION IMPLANTED CHAN STOPS

Filed Dec. 28, 1971 2 Sheets-Sheet 2

United States Patent Office 3,728,161

Patented Apr. 17, 1973

3,728,161

INTEGRATED CIRCUITS WITH ION IMPLANTED CHAN STOPS

Robert Alan Moline, Gillette, N.J., assignor to Bell Telephone Laboratories, Incorporated, Murray Hill, N.J.

Filed Dec. 28, 1971, Ser. No. 213,044

Int. Cl. H01l 7/54

U.S. Cl. 148—1.5 8 Claims

ABSTRACT OF THE DISCLOSURE

The specification describes a chan stop technique for eliminating spurious inversion of the surface of a semiconductor integrated circuit chip due to capacitive coupling between the metallization and/or the field oxide and the semiconductor. Spurious inversion is conventionally overcome by providing a low resistivity region, commonly referred to as a chan stop, uniformly under the field oxide. In making devices using ion implantation techniques, the channel or active region is first masked and the chan stop is formed by implantation or diffusion. After the field oxide is grown, the mask for forming the channel window must be aligned with the region previously masked. This alignment and the first masking step are eliminated in the process described by forming a uniform chan stop implant and compensating the chan stop impurities in the channel region by a compensation implant through the channel window. The chan stop and channel are thereby self-aligned.

As the size of devices in integrated circuits decreases, the attendant reduction in the thickness of the field insulator introduces the hazard of capacitive coupling between the first level of metallization and the semiconductor. If the capacitive coupling is strong enough to invert the surface of the semiconductor, current may leak between adjacent devices or may short elements of a single device. The susceptibility of the semiconductor surface to inversion is a direct function of the impurity concentration and insulator thickness. Inversion is also highly dependent on surface-state and fixed-charge density. Because of variations in these parameters that are difficult to control, a safety factor of 2–5 in the oxide thickness is prudent. In some integrated circuit designs this thickness is unacceptable. In such cases, it is necessary to reduce the capacitive coupling between the metallization (or the fixed charge in the insulator) and the semiconductor in some other way.

Capacitive coupling is routinely avoided by doping a perimeter region around the active region of each device. The voltage required to invert the perimeter region will be higher than the normal threshold voltage by an amount proportional to the added doping. The increased doping in the perimeter region is conventionally referred to as a "chan stop." It is evident that, if the silicon-silicon dioxide interface is of good quality, and the surface-state density low, e.g., $10^{11}$/cm.$^2$, a chan stop with a concentration of only $10^{12}$ atoms/cm.$^2$ will avoid inversion beneath a half micron oxide, for a 25 volt potential on the thick oxide.

This relationship can be expressed generally as follows:

$$N_{\text{chan stop}} > k\frac{V_T}{t}$$

where $N_{\text{chan stop}}$ is the impurity concentration of the chan stop layer in atoms/cm.$^2$, $V_T$ is the threshold voltage for inversion of the semiconductor surface, $t$ is the thickness of the field insulator in micrometers, and $k$ is a constant with a value of approximately $2\times10^{10}$ atoms.

Ion implantation methods have been applied to integrated circuit fabrication with considerable success. In applying these methods to integrated circuits with chan stops, the chan stop is typically formed as an initial step, with the channel region, i.e., the active region of each device, masked. The field insulator is then grown over the whole chip and the channel window is opened. It is necessary to align the channel window mask over the region formerly masked during the chan stop implant to avoid possible current leakage paths along the edges of the chan stop (e.g., source-to-drain leakage). The channel window may be made somewhat larger than the previously masked channel region so that the channel window overlaps the chan stop around the periphery of the channel. This allows minor errors in mask registration. However, a potential alignment error still exists.

The potential alignment error, and the mask step required for forming the chan stop, can be eliminated according to the invention by implanting the entire semiconductor surface with a sufficient concentration of impurities to avoid inversion by capacitive coupling from the metallization, and later forming the channel region by a compensation implant through the channel window. As indicated previously, the impurity concentration useful for the chan stop function is sufficiently low that compensation by a corresponding number of impurities of the opposite conductivity type is easily achieved.

The technique just described is particularly well adapted to the manufacture of field effect devices and is preferably used in connection with ion implantation fabrication procedures because it is largely the high degree of control over the impurity concentration available through implantation that allows the compensation step.

DESCRIPTION OF THE DRAWING

These and other aspects of the invention will be more evident from the following detailed description. In the drawing:

FIGS. 1A to 1F represent a process for the manufacture of field-effect devices by implantation techniques established in the art. The application of the invention will be described in connection with the fabrication of this kind of device as a preferred use of the invention. However, chan stops are useful for electrically isolating many forms of devices such as charge-coupled devices, and the expedient of patterning the useful areas of a uniform chan stop implant with a compensation implant has equally broad application.

In FIG. 1A a semiconductor substrate 10 is shown exposed to an ion beam (represented schematically by arrows) through a standard PR mask 11. The mask defines the channel region that is to become the active region of the device and which is to have a resistivity greater than that of the chan stop. In this embodiment, the channel resistivity will be the same as that of the substrate 10. Although the substrate material in these illustrations appears to be a bulk crystal, in practice the material 10 is likely to be an epitaxial layer. Also, for purposes of illustration, the substrate material 10 is assumed to be n-type and the devices formed in the channel region are p-channel, although the complimentary structures are equally useful. A typical resistivity value for the bulk material 10 is 10 ohm cm.

An exemplary implant useful for forming an effective chan stop is 50 kev. phosphorus with a dose of $8\times10^{11}$ ions/$cm^2$. From the relationships described above, this implant will prevent capacitive coupling across a half micron field oxide up to a voltage of 20 volts.

Figure 1A:
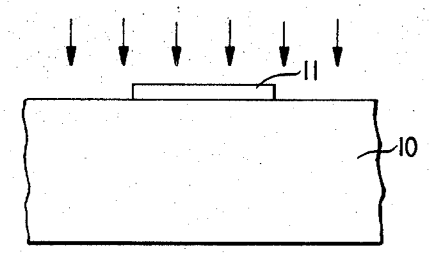
FIGS. 1A to 1F are front-sectional views of a portion of a semiconductor chip at various stages of processing by prior art techniques.
Figure 1B:
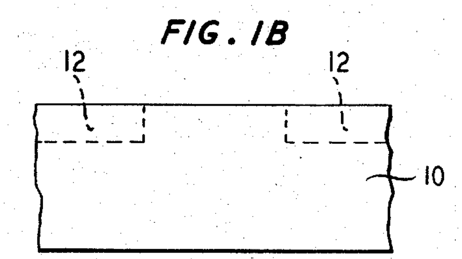

The implanted substrate with the mask removed is shown in FIG. 1B. The chan stop is denoted by numeral 12.

Figure 1C:
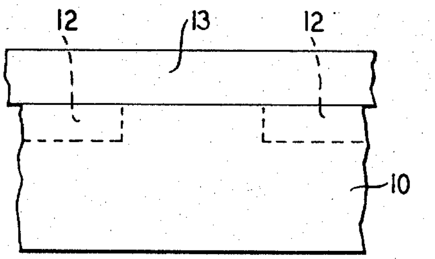

Referring to FIG. 1C, the field insulator 13 is shown covering the substrate. The field insulator is typically $SiO_2$, grown in steam at approximately 1000° C. or in dry $O_2$ at a comparable temperature. The thickness of the field oxide may vary considerably and as indicated previously, will have a direct bearing on the degree of capacitive coupling between the metallization in the finished device and the substrate 10.

Figure 1D:
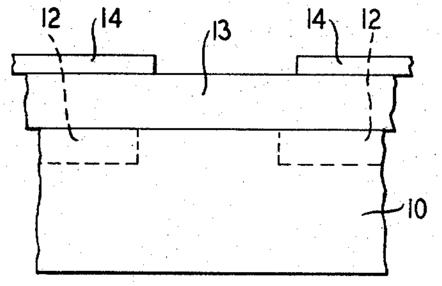

As shown in FIG. 1D the field insulator 13 is then masked with PR mask 14 to define the ultimate channel region. The mask 14 should be aligned with the implanted chan stop 12 for reasons that will become evident in the ensuing discussion. In FIG. 1D, the mask is purposely shown misaligned to illustrate the criticality of this registration step. In part, the present invention is directed toward overcoming the necessity for critical mask alignment.

Figure 1E:
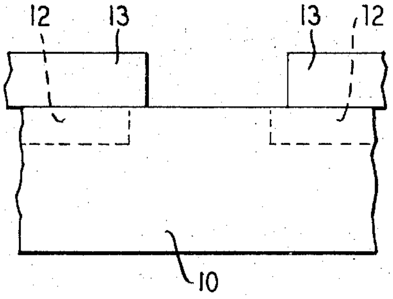

The channel is then etched as shown in FIG. 1E to form the channel window and expose the channel region. The etch step per se is conventional. If the field insulator is $SiO_2$, buffered HF may be used as the etchant.

Figure 1F:
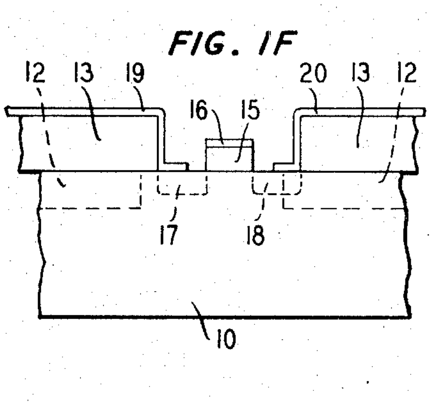

The device desired at this location on the chip is then formed in the window previously opened. As this example is directed to the formation of a field effect transistor, FIG. 1F shows the essential elements of this device, formed within the channel of the field insulator. Typically, the gate insulator 15 is grown over the exposed silicon within the window. The gate electrode 16 is then formed by depositing the gate electrode metal, typically silicon, tungsten, molybdenum or the like, over the insulator within the channel and selectively etching the metal to define the electrode within the channel. The gate electrode can then serve as the etch mask for opening the source and drain windows. The source 17, and drain 18, are then diffused through these windows, and the source and drain electrodes 19 and 20 are applied.

As an alternative and preferred embodiment, the source and drain regions are implanted. The implant can be made into the silicon exposed by the etch step just described or can be implanted through the insulator that previously covered the field insulator window in which case the etch step used for opening the source and drain windows become unnecessary. If the implant is made through the insulator, the gate electrode will typically perform the masking function against the ion beam. One virtue of the implantation method is the precise registration that is obtained between the gate electrode and the source and drain regions.

It will be noted that the misalignment that occurred in FIG. 1D has been carried over in the subsequent figures to illustrate the adverse effects. One of these is evident from FIG. 1F. Note that the drain region 18 overlaps the chan stop 12 while the source region 17 does not. This means that the capacitance of the drain junction will be greater than the capacitance of the source junction. If the mask is properly aligned, the structure has inherent symmetry and the capacitances will be equal (the source and drain regions may or may not overlap the chan stop at the option of the designer).

Figure 2:
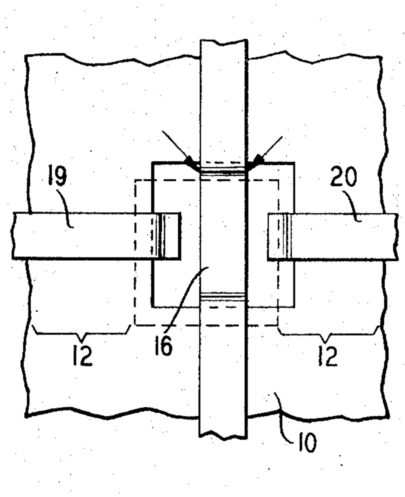
FIG. 2 is a plan view of the device of FIG. 1F, showing one result of misalignment occurring at the step indicated by FIG. 1D.

Another consequence of misalignment between the chan stop and the channel window is evident from the plan view of FIG. 2. Note that there exists a region, indicated by the arrows, beneath the gate electrode 16 that when inverted by capacitive coupling between the electrode 16 and the substrate will result in a parasitic device in parallel with the desired device with a turn-on voltage which is lower in some cases than the desired value.

The consequences of misalignment of the masking step described in connection with FIG. 1D, and indeed, the masking operation itself are eliminated according to the invention, one embodiment of which is described by the sequence of steps shown in FIGS. 3A to 3E. The basic approach is to form the chan stop by a uniform implant, and later compensate those regions where the chan stop is not wanted. A primary advantage resulting from this sequence is that the mask used for the compensation step is the channel window. This mask is necessary in any case and is therefore "free."

Figure 3A:
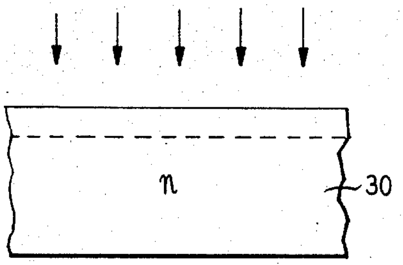
FIGS. 3A to 3E are front-sectional views of a semiconductor chip at various stages of processing according to the invention.

FIG. 3A shows schematically the implanting of 50 kev. P+ at a dose of $8\times10^{11}$/$cm.^2$. This is similar to the implant used in the prior art example so the electrical properties of the chan stop are the same. Formation of the field insulator 33, FIG. 3B, and etching the window in the field insulator, FIG. 3C, can be accomplished in the manner of the prior example, the only structural difference being the presence of the uniform chan stop layer 32 beneath the field insulator rather than the patterned chan stop layer in the former process. Procedurally it is important to note that there is no critical mask alignment at this point in the process.

Figure 3D:
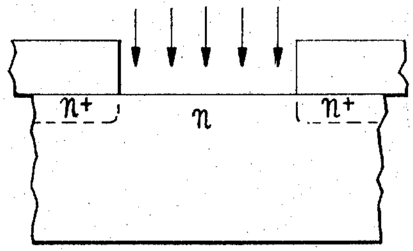
Figure 3B:
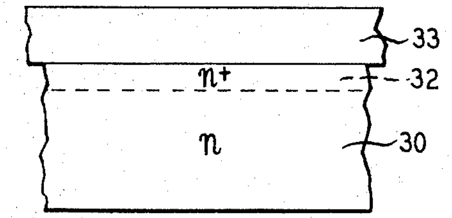

After the channel window is formed in the field insulator, the chan stop region in the window is eliminated by the compensation implant illustrated schematically in FIG. 3D. For example, 30 kev. B+ will give an impurity profile approximately that of the chan stop implant layer (taking into account thermal redistribution of the chan stop impurities during the thermal oxidation step). If the same number of impurities, i.e., $8\times10^{11}$, are implanted for compensation, then the original resistivity of the channel region is restored. The compensation step also provides a convenient opportunity for adjusting the resistivity of the channel region to essentially any desired value. Thus in order to tailor the gate threshold voltage one may wish to incorporate fewer or more atoms than the precise number necessary to compensate the chan stop implant. Ordinarily, the compensation implant will be within ±50 percent of the precise compensation value.

Alternatively, the compensation implant can be made after the gate insulator is grown, or deposited, in the channel window. The implant in this case is made through the insulating layer.

This alternative has special significance if boron is the compensating impurity. If the boron implant is made prior to the step of growing the insulating layer much of the boron may be consumed during the oxide growth. This results from the fact that phosphorus impurities tend to "snowplow" during oxide growth while boron impurities do not. Preferential consuming of boron can be overcome in at least two ways. The boron dose can be increased to allow for the consumption, or the boron implant can be made after the gate insulating layer is formed. In the latter case, if the gate insulating layer is 1000 A. of $SiO_2$, for example, the boron energy is appropriately 110 kev.

Figure 3E:
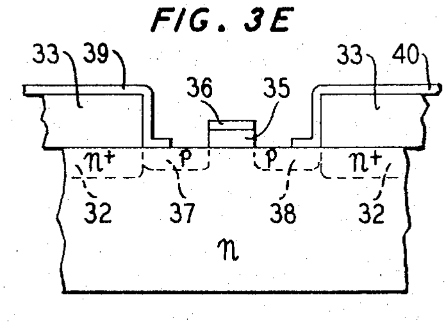
Figure 3C:
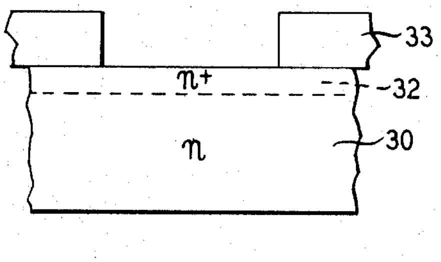

The field effect device configuration is shown in FIG. 3E with gate insulator 35, gate electrode 36, source and drain regions 37 and 38, and source and drain electrodes 39 and 40.

As indicated above, although the device of FIG. 3E is a p-channel device, the complementary device can be made according to the invention as well. In that case the chan stop impurities would normally be boron, advantageously implanted through the field oxide uniformly over the semiconductor surface and the chan stop compensating impurities would be phosphorous, antimony or arsenic.

While the teachings described herein have a precisely unique objective the sequence of steps used to reach the objective are remarkably simple and will no doubt resemble superficially processing sequences that have been described before. For example, if the bulk impurities in the substrate are implanted (see e.g., Dalton et al. Ser. No. 156,400, filed June 24, 1971) and the channel region is later implanted to tailer the gate threshold voltage, a technique known in the art, such a process would resemble that described here. However, it is desirable to restrict the chan stop implant to a surface region, the major portion of the chan stop impurities should lie within $1\mu$ of the surface. This allows compensation in the same surface portion and results in a finished device with greater uniformity and reproducability of electrical characteristics. Thus it may be holpful to recognize that both implantation steps involve, according to this invention, surface implants, i.e., with a major portion of implanted atoms within $1\mu$ of the semiconductor surface.

Various additional modifications and extensions of this invention will become apparent to those skilled in the art. All such variations and deviations which basically rely on the teachings through which this invention has advanced the art are properly considered within the spirit and scope of this invention.

What is claimed is:

1. A method for overcoming unwanted inversion due to capacitive coupling between the metallization and/or the field oxide and a semiconductor substrate comprising the steps of:

implanting into the surface regions of the semiconductor a uniform impurity layer with an impurity concentration selected so as to avoid inversion of the semiconductor surface due to capacitive coupling between the metallization and/or the field oxide and the substrate of the integrated circuit, masking those regions of the layer in which said inversion is to be avoided, leaving unmasked regions, and implanting into the unmasked regions ions of an impurity of the opposite conductivity type, the ions having a concentration and energy sufficient to at least partially compensate the unmasked semiconductor regions for the electrical effects of the impurity layer formerly implanted.

2. The method of claim 1 in which the semiconductor is silicon.

3. The method of claim 1 in which the first impurity layer is at least 50 percent compensated by the second implant.

4. A method for fabricating a device in a semiconductor substrate comprising the steps of:

implanting into the semiconductor substrate a uniform resistivity channel stop layer, the layer having an impurity concentration defined by the following formula:

$$N_{\text{chan stop}} > k \times \frac{V_T}{t}$$

where $N_{\text{chan stop}}$ is the impurity concentration of the chan stop layer in atoms/cm.$^2$, $V_T$ is the threshold voltage for inversion of the semiconductor surface, $t$ is the thickness of the field insulator in micrometer, and $k$ is approximately $2 \times 10^{10}$ atoms, growing the field insulator, masking the channel region of the field insulator underneath which inversion is to be avoided, etching the field insulator to expose the channel window, implanting into the channel window chan stop compensating impurities having a conductivity type opposite to that of the chan stop layer and an amount equal to $N_{\text{chan stop}} \pm 50$ percent.

5. The method of claim 4 in which the semiconductor is silicon and the field insulator comprises silicon dioxide.

6. The method of claim 4 further including the steps of providing a gate insulator, gate electrode, source and drain regions, and source and drain contacts within said channel to form a field-effect transistor.

7. The method of claim 5 in which the $N_{\text{chan stop}}$ impurities are phosphorous and the chan stop compensating impurities are boron.

8. The method of claim 5 in which the $N_{\text{chan stop}}$ impurities are boron and the chan stop compensating impurities are phosphorous, antimony, or arsenic.

References Cited

UNITED STATES PATENTS

| | | | |
|---|---|---|---|
| 3,390,019 | 6/1968 | Manchester | 148—1.5 |
| 3,412,460 | 11/1968 | Lin | 148—187 |
| 3,513,035 | 5/1970 | Fitzgerald et al. | 148—1.5 |
| 3,586,542 | 6/1971 | MacRae | 148—1.5 |

CHARLES N. LOVELL, Primary Examiner

J. M. DAVIS, Assistant Examiner

U.S. Cl. X.R.

148—187; 317—235 B, 235 E